(12) United States Patent
Ji

(10) Patent No.: US 12,308,316 B2
(45) Date of Patent: May 20, 2025

(54) ANTI-FUSE STORAGE LAYOUT AND CIRCUIT THEREOF, AND ANTI-FUSE MEMORY AND DESIGN METHOD THEREOF

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 662 days.

(21) Appl. No.: 17/712,067

(22) Filed: Apr. 2, 2022

(65) Prior Publication Data
US 2023/0207456 A1 Jun. 29, 2023

(30) Foreign Application Priority Data
Dec. 23, 2021 (CN) .......................... 202111590314.8

(51) Int. Cl.
*H01L 23/525* (2006.01)
*G11C 17/16* (2006.01)
*H10B 20/20* (2023.01)

(52) U.S. Cl.
CPC ........ *H01L 23/5252* (2013.01); *G11C 17/165* (2013.01); *H10B 20/20* (2023.02)

(58) Field of Classification Search
CPC ... H01L 23/5252; G11C 17/165; G11C 17/16; G11C 17/18; G11C 5/025; G11C 5/06; H10B 20/20; H10B 20/25; H10D 12/01; Y02D 10/00
See application file for complete search history.

(56) References Cited

U.S. PATENT DOCUMENTS

| 2016/0148705 A1* | 5/2016 | Lee | G11C 17/18 365/96 |
| 2017/0206980 A1* | 7/2017 | Wong | G11C 16/32 |
| 2018/0204843 A1* | 7/2018 | Son | G11C 17/16 |

FOREIGN PATENT DOCUMENTS

WO 2003034331 A1 4/2003

* cited by examiner

*Primary Examiner* — Jonathan Han
(74) *Attorney, Agent, or Firm* — Kilpatrick Townsend & Stockton LLP

(57) ABSTRACT

Embodiments provide an anti-fuse storage layout and a circuit thereof, and an anti-fuse memory and a design method thereof. The anti-fuse storage layout includes: active regions extending along a first direction and being discretely arranged along a second direction, each of the active regions including at least two memory cell regions arranged along the first direction, each of the at least two memory cell regions including an anti-fuse region and a control region arranged along the first direction, and the control regions of the adjacent memory cell regions being adjacent to each other along the first direction; a word line region extending along the second direction and intersecting with the control region; an electrical connection region extending along the second direction and intersecting with the anti-fuse region; and a programming control region extending along a third direction and being positioned at one side of the corresponding active region.

14 Claims, 8 Drawing Sheets

ANTI-FUSE STORAGE LAYOUT AND CIRCUIT THEREOF, AND ANTI-FUSE MEMORY AND DESIGN METHOD THEREOF

CROSS REFERENCE TO RELATED APPLICATION

This application claims priority to Chinese Patent Application No. 202111590314.8, titled "ANTI-FUSE STORAGE LAYOUT AND CIRCUIT THEREOF, AND ANTI-FUSE MEMORY AND DESIGN METHOD THEREOF" and filed to the China National Intellectual Property Administration on Dec. 23, 2021, the entire contents of which are incorporated herein by reference.

TECHNICAL FIELD

Embodiments of the present disclosure relate to the field of semiconductor circuit design, and more particularly, to an anti-fuse storage layout and a circuit thereof, and an anti-fuse memory and a design method thereof.

BACKGROUND

An anti-fuse memory may be realized by means of an anti-fuse memory cell array. A gate oxide dielectric of an anti-fuse memory cell may be broken down after a high voltage is applied, and an impedance of a path broken down will decrease. By detecting a resistance state of the path broken down, information stored in the anti-fuse memory cell may be read out.

However, when a high voltage is applied to a certain memory cell region for programming, the high voltage may cause interference or damage to other memory cell region adjacent to the foregoing one. Moreover, in a data programming phase of the anti-fuse memory, a discharge transistor configured to discharge a transmission wire needs to be rapidly discharged. Therefore, the discharge transistor is generally designed as a transistor with a thicker gate dielectric layer, which is not advantageous to reducing a layout area of an anti-fuse storage layout, and is not advantageous to reducing a size of the anti-fuse memory.

SUMMARY

Embodiments of the present disclosure provide an anti-fuse storage layout and a circuit thereof, and an anti-fuse memory and a design method thereof, which are at least advantageous to reducing a layout area of the anti-fuse storage layout.

According to some embodiments of the present disclosure, one aspect of the embodiments of the present disclosure provides an anti-fuse storage layout, including: active regions extending along a first direction and being discretely arranged along a second direction, each of the active regions including at least two memory cell regions arranged along the first direction, each of the at least two memory cell regions including an anti-fuse region and a control region arranged along the first direction, the control regions of the adjacent memory cell regions being adjacent to each other along the first direction, the anti-fuse region being configured to define an anti-fuse transistor, and the control region being configured to define a control transistor; a word line region extending along the second direction and intersecting with the control region, the word line region being configured to define a word line electrically connected to a gate of the control transistor; an electrical connection region extending along the second direction and intersecting with the anti-fuse region, the electrical connection region being configured to define an electrical connection layer electrically connected to a gate of the anti-fuse transistor; and a programming control region extending along a third direction and being positioned at one side of the corresponding active region, the programming control region intersecting with the electrical connection region arranged along the first direction, the programming control region being configured to define a programming control layer, and the programming control layer being electrically connected to the electrical connection layer arranged along the first direction.

In some embodiments, the programming control region and the electrical connection region are in the same layer, and the programming control region and the electrical connection region are adjacent to each other.

In some embodiments, the programming control region and the electrical connection region are in different layers, and the programming control region and the electrical connection region have a facing region.

In some embodiments, the anti-fuse storage layout also includes: a through-hole region positioned in the facing region between the programming control region and the electrical connection region. The through-hole region is configured to define a conductive pillar, and the conductive pillar is electrically connected to the electrical connection layer and the programming control layer.

In some embodiments, the first direction is the same as the third direction.

In some embodiments, the first direction is perpendicular to the second direction.

In some embodiments, the active region is configured to define an N-type active layer.

In some embodiments, the anti-fuse storage layout also includes a bit line region extending along the first direction, wherein the bit line region is configured to define a bit line electrically connected to the control transistor arranged along the first direction.

According to some embodiments of the present disclosure, another aspect of the embodiments of the present disclosure also provides an anti-fuse memory, including: at least two memory cells arranged along a first direction and a second direction, each of the at least two memory cells including an anti-fuse transistor and a control transistor arranged along the first direction, a gate structure of the anti-fuse transistor including a first gate dielectric layer and a first gate layer arranged in a stack, and a gate structure of the control transistor including a second gate dielectric layer and a second gate layer arranged in a stack; a word line layer, the word line layer extending along the second direction and being electrically connected to the second gate layer of the control transistor arranged along the second direction; an electrical connection layer, the electrical connection layer extending along the second direction and being electrically connected to the first gate layer of the anti-fuse transistor; and a programming control layer, the programming control layer extending along a third direction and being electrically connected to the first gate layer arranged along the first direction by means of the electrical connection layer.

In some embodiments, the electrical connection layer and the programming control layer are in the same layer.

In some embodiments, the electrical connection layer and the programming control layer are in different layers; and the anti-fuse memory also includes a conductive pillar. The conductive pillar is positioned between the electrical connection layer and the programming control layer, and is electrically connected to the electrical connection layer and the programming control layer.

In some embodiments, a thickness of the first gate dielectric layer is less than or equal to 30 angstroms, and a thickness of the second gate dielectric layer is less than or equal to 30 angstroms.

In some embodiments, the anti-fuse memory also includes a bit line layer extending along the first direction, wherein the bit line layer is electrically connected to the control transistor arranged along the first direction.

According to some embodiments of the present disclosure, yet another aspect of the embodiments of the present disclosure also provides a design method for an anti-fuse memory, wherein the design method is configured for designing the anti-fuse memory described in any one of the above embodiments. The design method includes: defining the memory cell programming in the two adjacent memory cells arranged along the first direction as a first memory cell, and defining the memory cell not programming as a second memory cell, a node configured to connect the control transistor and the anti-fuse transistor in the second memory cell being defined as a connection node, a first parasitic capacitance being provided between the first gate layer and the connection node, a second parasitic capacitance being provided between the second gate layer and the connection node, a voltage difference threshold being provided between the first gate layer and the connection node in the second memory cell during the programming, the voltage difference threshold being defined as a voltage difference between the first gate layer and the connection node corresponding to breakdown of the anti-fuse transistor, and a voltage of the programming control layer corresponding to the first memory cell being defined as a programming voltage; obtaining a relationship between the first parasitic capacitance and the second parasitic capacitance based on the programming voltage and the voltage difference threshold; and based on the relationship between the first parasitic capacitance and the second parasitic capacitance, designing a channel size of the anti-fuse transistor and/or a thickness of the first gate dielectric layer in the second memory cell, and designing a channel size of the control transistor and/or a thickness of the second gate dielectric layer in the second memory cell.

In some embodiments, the first parasitic capacitance, the second parasitic capacitance, the programming voltage and the voltage difference threshold satisfy an equation as below: $U=R1*U0/(R1+R2)$, wherein U represents an arbitrary value less than or equal to the voltage difference threshold, U0 represents the programming voltage, R1 represents a first capacitive reactance corresponding to the first parasitic capacitance, and R2 represents a second capacitive reactance corresponding to the second parasitic capacitance.

According to some embodiments of the present disclosure, still another aspect of the embodiments of the present disclosure also provides an anti-fuse storage circuit, including: a plurality of memory cells, each of the plurality of memory cells including an anti-fuse transistor and a control transistor connected to each other, and a connection node between the anti-fuse transistor and the control transistor being defined as a reference node; a bit line connected to the anti-fuse transistors arranged along a first direction, each of the anti-fuse transistors being electrically connected to the bit line by means of the control transistor; a word line connected to a gate of the control transistor arranged in a second direction, the word line being configured to enable the selected control transistor according to a row strobe signal, such that the bit line is electrically connected to the anti-fuse transistor; and a programming control line connected to a gate of the anti-fuse transistor arranged along the first direction, the anti-fuse transistor being configured to programme according to a programming signal provided by the programming control line. There is a first parasitic capacitance between the gate of the anti-fuse transistor and the reference node, and there is a second parasitic capacitance between the gate of the control transistor and the reference node. During programming by means of the anti-fuse transistor of a selected one of the plurality of memory cells, the reference nodes of the adjacent anti-fuse transistors are coupled to a preset voltage, and a difference value between the preset voltage and a voltage of the programming signal is less than or equal to a voltage difference threshold, wherein the voltage difference threshold is a voltage difference between the gate and a drain corresponding to breakdown of the anti-fuse transistor.

The technical solutions provided by the embodiments of the present disclosure have following advantages.

In the above-mentioned anti-fuse storage layout, the word line region extends along the second direction, and the programming control region extends along the third direction. In this case, an arrangement direction of the word line region and the an arrangement direction of the programming control region are staggered, such that the anti-fuse transistors in the adjacent memory cell regions sharing the active region are electrically connected to the same programming control region, while the control transistors in the adjacent memory cell regions sharing the active region are electrically connected to different word line regions. In this way, when the anti-fuse transistor in one of the adjacent memory cell regions is programmed by means of the programming control region, the control transistor in this memory cell region may be enabled by means of the word line region electrically connected to this memory cell region. Meanwhile, the control transistor in the other memory cell region sharing the active region with this first memory cell region is electrically connected to other word line region, so the control transistor in the other memory cell region sharing the active region with this first memory cell region is not enabled. Thus the anti-fuse transistor in the other memory cell region sharing the active region with this first memory cell region is not programmed. In this way, when a certain memory cell region is programmed, it is avoidable causing interference or damage to other memory cell region adjacent to the foregoing one. In addition, to protect a memory cell region adjacent to the memory cell region that needs to be programmed, the anti-fuse storage layout provided by the embodiments of the present disclosure does not need to be provided with a precharge region. In one aspect, this is advantageous to reducing a layout area of the anti-fuse storage layout, such that it is advantageous to reducing costs of the anti-fuse memory fabricated according to the anti-fuse storage layout and reducing the size of the anti-fuse memory. In another aspect, a precharge operation is not required when programming a certain memory cell region, which is advantageous to simplifying an operation timing sequence.

BRIEF DESCRIPTION OF THE DRAWINGS

Exemplary descriptions are made to one or more embodiments with reference to pictures in the corresponding drawings, and these exemplary descriptions do not constitute limitations on the embodiments, and elements with the same reference numerals in the drawings are denoted as similar elements. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
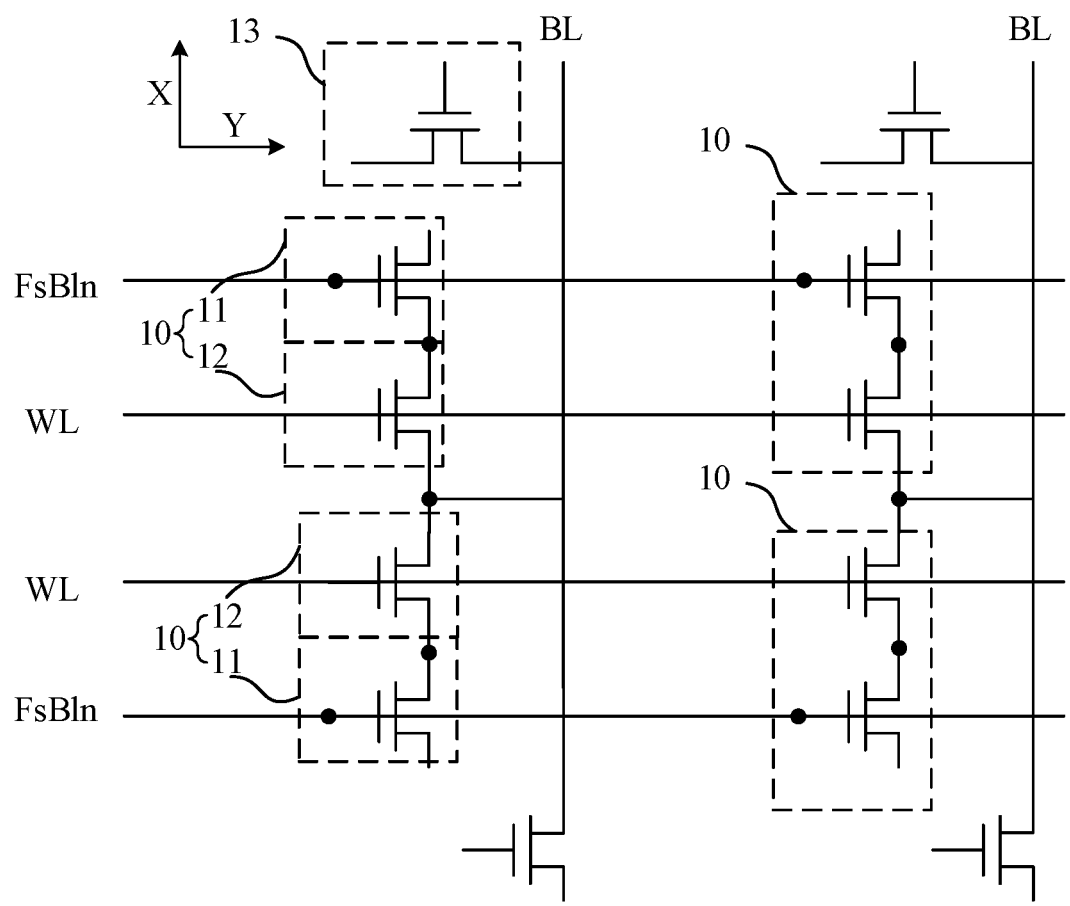
FIG. 1 is a schematic diagram showing a circuit structure of an anti-fuse storage circuit.
Figure 2:
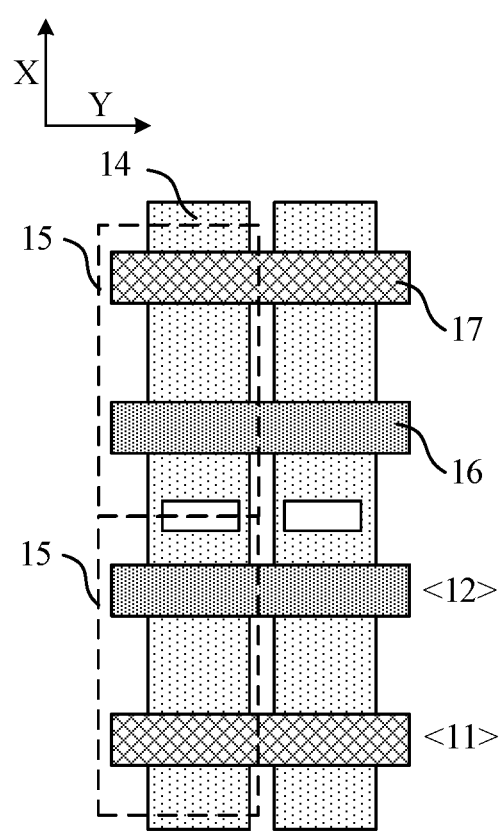
FIG. 2 is a schematic diagram showing a layout structure of the anti-fuse storage circuit corresponding to FIG. 1.

FIG. 1 is a schematic diagram showing a circuit structure of an anti-fuse storage circuit; and FIG. 2 is a schematic diagram showing a layout structure of the anti-fuse storage circuit corresponding to FIG. 1.

Referring to FIG. 1, the anti-fuse storage circuit includes: a plurality of memory cells 10, each of the plurality of memory cells 10 including an anti-fuse transistor 11 and a control transistor 12 connected to each other; a bit line BL connected to the anti-fuse transistors 11 arranged along a first direction X, each of the anti-fuse transistors 11 being electrically connected to the bit line BL by means of the control transistor 12; a word line WL connected to a gate of the control transistor 12 arranged in a second direction Y, the word line WL being configured to enable the selected control transistor 12 according to a row strobe signal, such that the bit line BL is electrically connected to the anti-fuse transistor 11; a programming control line FsBln connected to a gate of the anti-fuse transistor 11 arranged along the second direction Y, the anti-fuse transistor 11 being configured to programme according to a programming signal provided by the programming control line FsBln; and a precharge circuit 13 configured to set the bit line BL to a preset voltage, such that when the control transistor 12 connected to the bit line BL at the preset voltage is enabled, no high voltage will be generated between the gate and a drain of the anti-fuse transistor 11 in the same memory cell 10 as the enabled control transistor 12. In this way, protection of the anti-fuse transistor 11 is achieved.

Referring to FIG. 2, the anti-fuse storage layout may include: active regions 14 extending along the first direction X and discretely arranged along the second direction Y, each of the active regions 14 including at least two memory cell regions 15 arranged along the first direction X, each of the at least two memory cell regions 15 including an anti-fuse region <11> and a control region <12>; a word line region 16 extending along the second direction Y and electrically connected to the control transistor <12>; and a programming control region 17 also extending along the second direction Y and being electrically connected to the anti-fuse region <11> arranged along the second direction Y.

It is not difficult to find that in the anti-fuse array of the prior art, the programming control line FsBln is consistent with the word line WL in extending direction (i.e., the second direction Y). That is, the gates of at least two control transistors 12 in adjacent memory cells 10 arranged along the second direction Y are electrically connected to the same word line WL, and the gates of at least two anti-fuse transistors 11 are electrically connected to the same programming control line FsBln.

In this way, when one anti-fuse transistor 11 in the adjacent memory cells 10 arranged along the second direction Y is programmed, the programming control line FsBln electrically connected to this anti-fuse transistor 11 is set to a high voltage such as 5V~6V, the bit line BL electrically connected to this anti-fuse transistor 11 is pulled down to a low potential, and the word line WL electrically connected to the anti-fuse transistor 11 is set to a high level. At this moment, a voltage difference between the gate and the drain of this anti-fuse transistor 11 will reach 5V~6V. Such a voltage difference may break down a gate dielectric layer of this anti-fuse transistor 11, thereby resulting in a low-impedance path. However, to protect other anti-fuse transistor 11 sharing the programming control line FsBln with this first anti-fuse transistor 11, it is required to set the bit line BL electrically connected to the other anti-fuse transistor 11 to a preset voltage by means of the precharge circuit 13, such that the drain of the other anti-fuse transistor 11 is at the preset voltage to reduce the voltage difference between the gate and the drain of the other anti-fuse transistor 11, thereby preventing the other anti-fuse transistor 11 from being broken down. In this way, the objective of protecting a memory cell 10 adjacent to the memory cell 10 needing to be programmed is achieved.

In addition, the control transistor 12 generally adopts a transistor with a thicker gate dielectric layer, such as a transistor with a gate dielectric layer thickness of 60 angstroms. This is advantageous to making a gate voltage of the control transistor 12 larger when it is enabled, which in turn fully transmits the voltage of the precharge circuit to the drain of the anti-fuse transistor 11 to achieve the protection of the anti-fuse transistor 11. The anti-fuse transistor 11 generally adopts a transistor with a thinner gate dielectric layer, such as a transistor with a gate dielectric layer thickness of 30 angstroms. In this way, it is ensured that when the control transistor 12 is enabled, the voltage difference between the gate and the drain of the anti-fuse transistor 11 can break down the target gate dielectric layer to realize programming. With the gradual progress of semiconductor manufacturing technologies, it is urgent to use a transistor with a thinner gate dielectric layer as the control transistor 12 to shrink the area of an anti-fuse unit and to reduce manufacturing costs of the anti-fuse memory. However, based on the existing anti-fuse array, if the control transistor 12 adopts a transistor with a thinner gate dielectric layer, when the control transistor 12 is enabled, the preset voltage provided by the precharge circuit 13 cannot be fully transmitted to the drain of the anti-fuse transistor 11. That is, it is unable to effectively reduce the voltage difference between the gate and the drain of the anti-fuse transistor 11. As a result, when a certain memory cell 10 is programmed, other memory cell 10 adjacent to this memory cell 10 is easily damaged.

The embodiments of the present disclosure provide an anti-fuse storage layout and a circuit thereof, and an anti-fuse memory and a design method thereof. In the anti-fuse storage layout, when an anti-fuse transistor in a certain memory cell region is programmed by means of a programming control region, another memory cell region sharing an active region with the first memory cell region is not to be programmed. In this way, when a certain memory cell region is programmed, it is avoidable causing interference or damage to other memory cell region adjacent to the foregoing one. In addition, to protect a memory cell region adjacent to the memory cell region that needs to be programmed, the anti-fuse storage layout provided by the embodiments of the present disclosure does not need to be provided with a precharge region. In one aspect, this is advantageous to reducing a layout area of the anti-fuse storage layout, such that it is advantageous to reducing costs of the anti-fuse memory fabricated according to the anti-fuse storage layout and reducing the size of the anti-fuse memory. In another aspect, a precharge operation is not required when programming a certain memory cell region, which is advantageous to simplifying an operation timing sequence.

To make the objectives, technical solutions and advantages of the embodiments of the present disclosure more clear, the embodiments of the present disclosure will be described in detail below with reference to the accompanying drawings. However, a person of ordinary skill in the art may understand that in the embodiments of the present disclosure, many technical details are put forward such that a reader may better understand the present disclosure. However, the technical solutions requested to be protected by the present disclosure may also be implemented even without these technical details or various variations and modifications based on the following embodiments.

An embodiment of the present disclosure provides an anti-fuse storage layout. The anti-fuse storage layout provided by an embodiment of the present disclosure will be described in detail below with reference to the accompanying drawings. FIG. 3 to FIG. 6 are schematic structural diagrams of four types of anti-fuse storage layouts according to an embodiment of the present disclosure.

Figure 3:
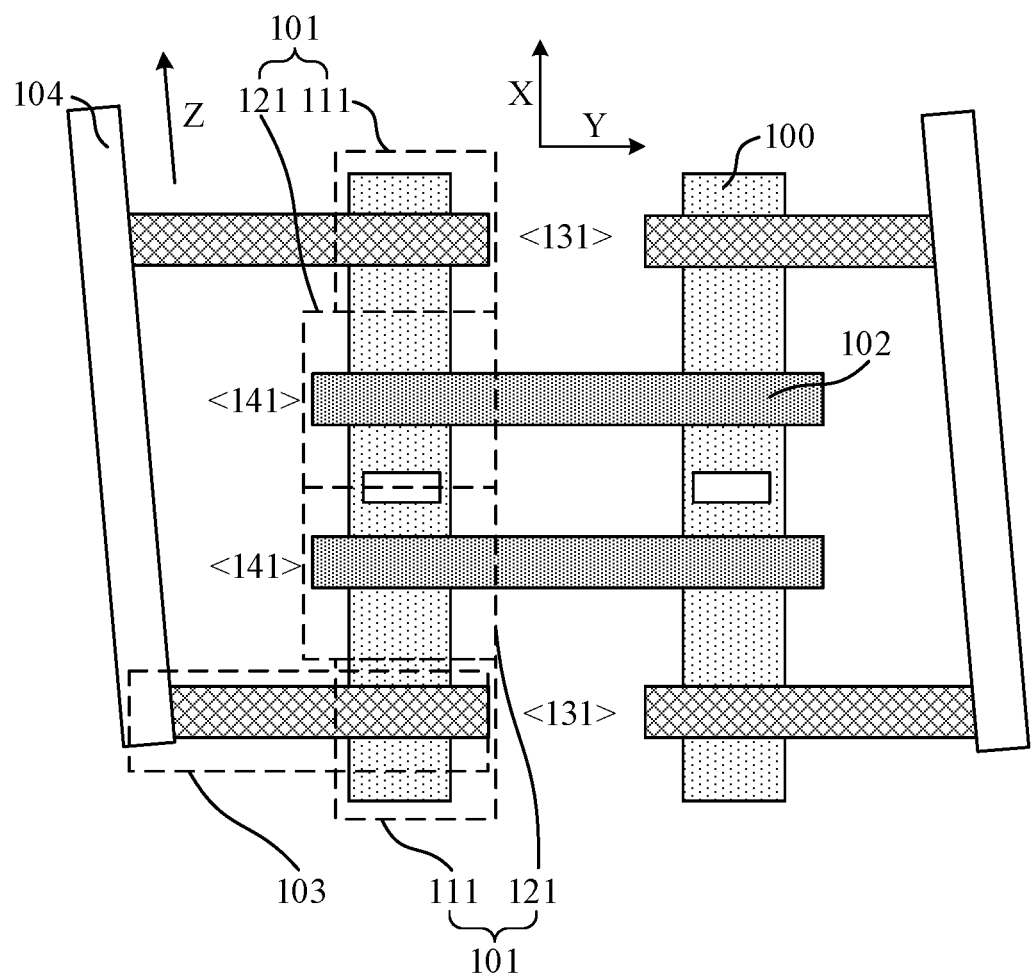
FIG. 3 to FIG. 6 are schematic structural diagrams of four types of anti-fuse storage layouts according to an embodiment of the present disclosure.
Figure 4:
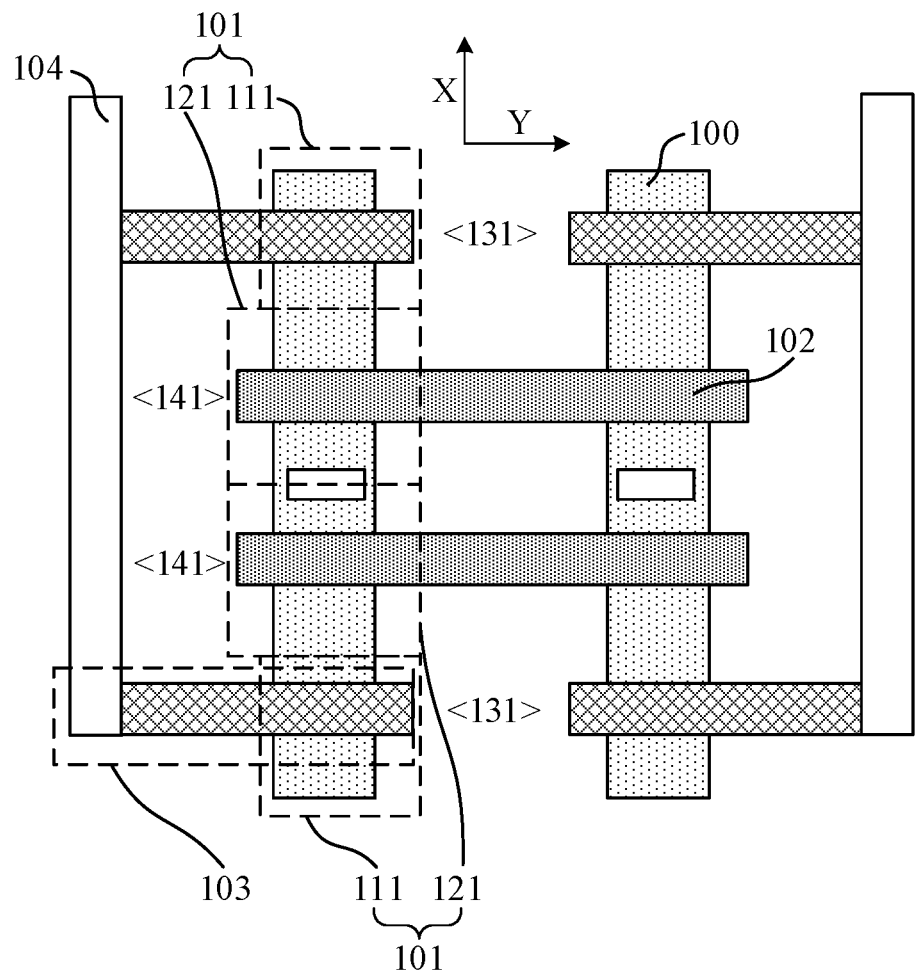

Referring to FIG. 3 and FIG. 4, the anti-fuse storage layout includes: active regions 100 extending along a first direction X and being discretely arranged along a second direction Y, each of the active regions 100 including at least two memory cell regions 101 arranged along the first direction X, each of the at least two memory cell regions 101 including an anti-fuse region 111 and a control region 121 arranged along the first direction X, the control regions 121 of the adjacent memory cell regions 101 being adjacent to each other along the first direction X, the anti-fuse region 111 being configured to define an anti-fuse transistor <131>, and the control region 121 being configured to define a control transistor <141>; a word line region 102 extending along the second direction Y and intersecting with the control region 121, the word line region 102 being configured to define a word line electrically connected to a gate of the control transistor <141>; an electrical connection region 103 extending along the second direction Y and intersecting with the anti-fuse region 111, the electrical connection region 103 being configured to define an electrical connection layer electrically connected to a gate of the anti-fuse transistor <131>; and a programming control region 104 extending along a third direction Z and being positioned at one side of the corresponding active region 100, the programming control region 104 intersecting with the electrical connection region 103 arranged along the first direction X, the programming control region 104 being configured to define a programming control layer, and the programming control layer being electrically connected to the electrical connection layer arranged along the first direction X.

In this way, the extension direction of the word line region 102 is different from the extension direction of the programming control region 104, such that the anti-fuse transistors <131> in the adjacent memory cell regions 101 sharing the active region 100 are electrically connected to the same programming control region 104, while the control transistors <141> in the adjacent memory cell regions 101 sharing the active region 100 are electrically connected to different word line regions 102. In this way, when the anti-fuse transistor <131> in a certain memory cell region 101 is programmed by means of the programming control region 104, the control transistor <141> is enabled by means of the word line region 102 electrically connected to the control transistor <141> in this memory cell region 101. Meanwhile, the control transistor <141> in the other memory cell region 101 sharing the programming control region 104 is electrically connected to other word line region 102, so the control transistor <141> in the other memory cell region 101 sharing the programming control region 104 is not enabled. Thus the anti-fuse transistor <131> in the same memory cell region 101 as this control transistor <141> not enabled is not programmed. In this way, when a certain memory cell region 101 is programmed, it is avoidable causing interference or damage to other memory cell region 101 adjacent to the foregoing one.

In addition, to protect a memory cell region 101 adjacent to the memory cell region 101 that needs to be programmed, the anti-fuse storage layout provided by the embodiments of the present disclosure does not need to be provided with a precharge region. In one aspect, this is advantageous to reducing the area of the anti-fuse storage layout, such that it is advantageous to reducing fabrication costs of the anti-fuse memory. In another aspect, a precharge operation is not required when programming a certain memory cell region 101, which is advantageous to simplifying an operation timing sequence.

In some embodiments, the programming control region 104 and the electrical connection region 103 are in the same layer, and the programming control region 104 is adjacent to the electrical connection region 103. This is advantageous to reducing the overall thickness of the anti-fuse memory fabricated according to the anti-fuse storage layout.

In some embodiments, the programming control region 104 and the electrical connection region 103 are in different layers, and the programming control region 104 and the electrical connection region 103 have a facing region. That is, an orthographic projection of the programming control region 104 on the active region 100 at least partially overlaps with an orthographic projection of the electrical connection region 100 on the active region 100.

In some embodiments, if the programming control region 104 and the electrical connection region 103 are in different layers, the anti-fuse storage layout may also include a through-hole region (not shown in the figure). The through-hole region is positioned in the facing region between the programming control region 104 and the electrical connection region 103, and the through-hole region is configured to define a conductive pillar electrically connected to the electrical connection layer and the programming control layer.

It is to be noted that in practical applications, the programming control region 104 and the electrical connection region 103 may not have the facing area. Due to limitations of conductive materials of the programming control region 104 and the electrical connection region 103, a contact resistance of a direct contact between the programming control region 104 and the electrical connection region 103 may be relatively large, so a transition material may be employed for transition. That is, an electrical connection between the programming control region 104 and the electrical connection region 103 is as below: the programming control region 104-the transition material-the conductive pillar-the transition material-the electrical connection region 103. In this way, transmission efficiency of electrical signals between the programming control region 104 and the electrical connection region 103 is improved.

In any one of the above embodiments, referring to FIG. 4, the first direction X may be the same as the third direction Z (referring to FIG. 3). This is advantageous to making arrangement between the various regions in the anti-fuse storage layout more compact and regular, and thus is advantageous to further reducing the total layout area of the anti-fuse storage layout. In other embodiments, an angle may also be provided between the first direction and the third direction.

In any one of the above embodiments, referring to FIG. 3 or FIG. 4, the first direction X is perpendicular to the second direction Y. This is also advantageous to making the arrangement between the various regions in the anti-fuse storage layout more compact and regular, and thus is advantageous to further reducing the total layout area of the anti-fuse storage layout. In other embodiments, the angle between the first direction and the second direction also may not be 90°.

In any one of the above embodiments, the active region 100 may be configured to define an N-type active layer. In other embodiments, the active region 100 is also configured to define a P-type active layer.

Figure 5:
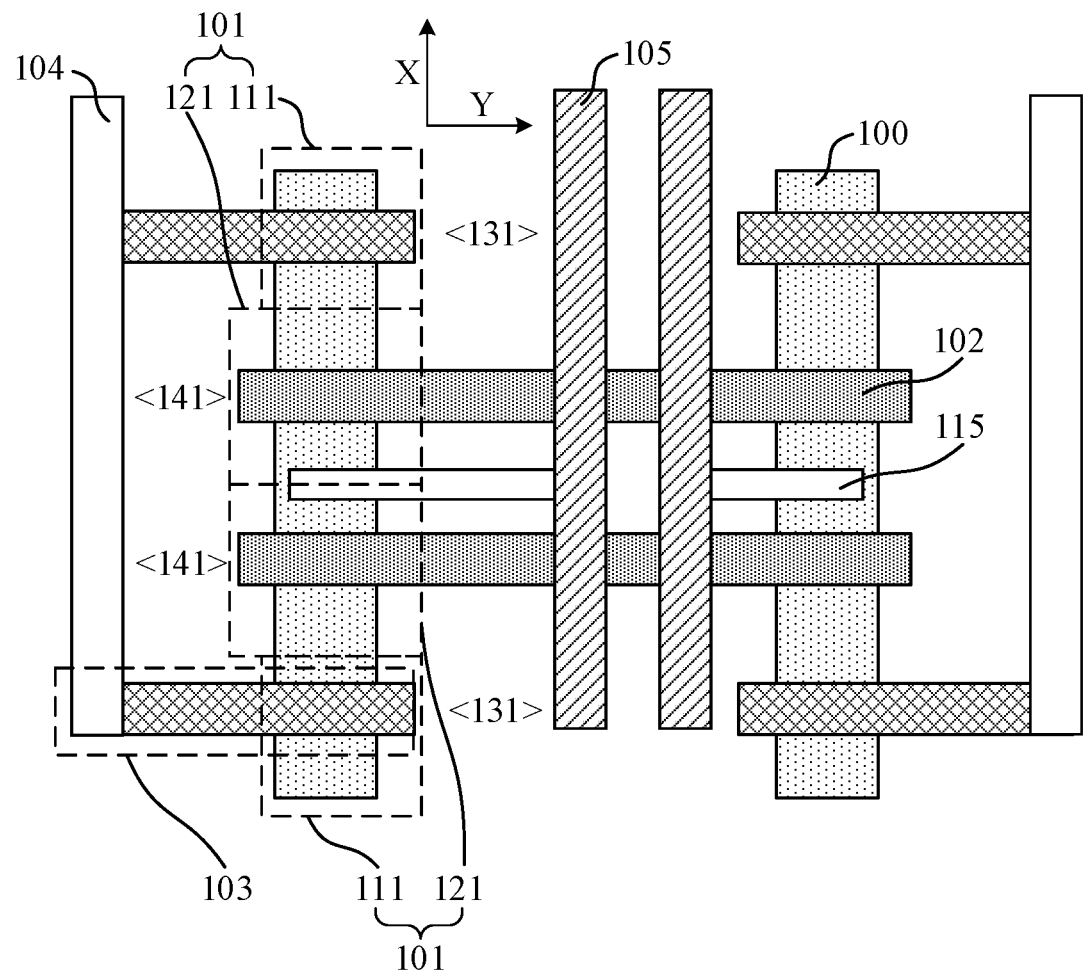
Figure 6:
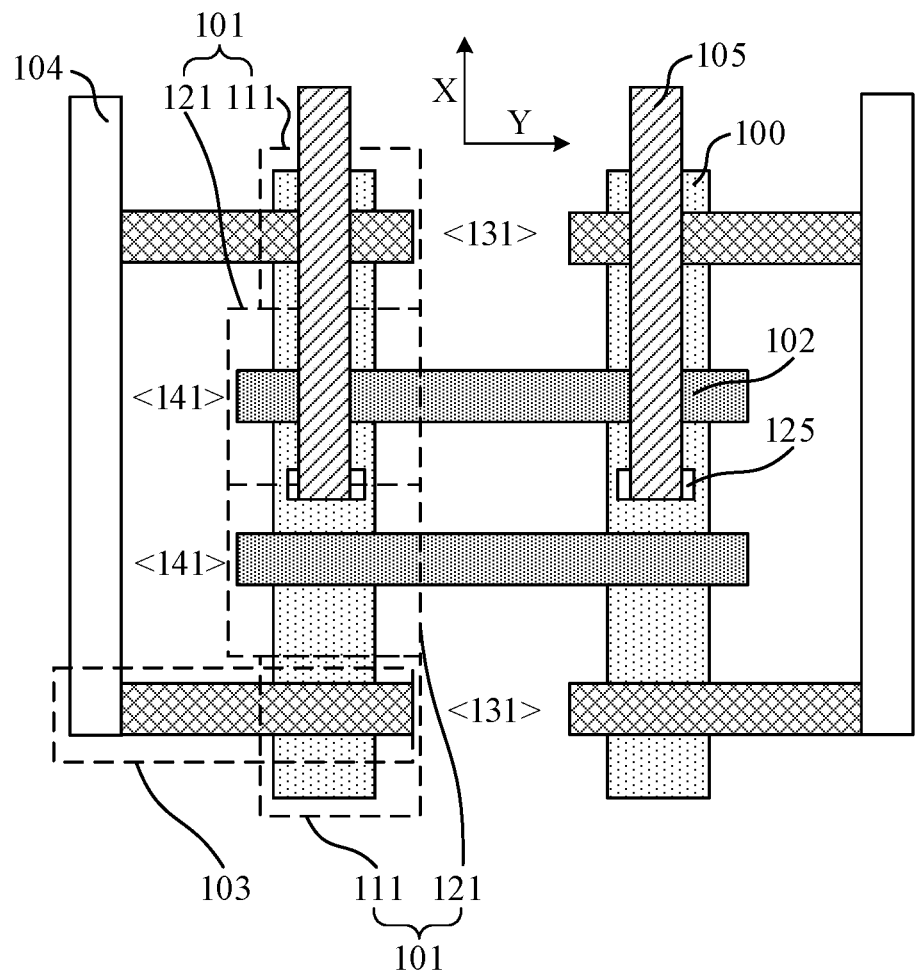

In some embodiments, referring to FIG. 5 or FIG. 6, the anti-fuse storage layout may also include a bit line region 105 extending along the first direction X, wherein the bit line region 105 is configured to define bit lines electrically connected to the control transistors <141> arranged along the first direction X.

In some examples, referring to FIG. 5, the bit line region 105 may be positioned on a side of the corresponding active region 100. That is, no facing region is provided between the bit line region 105 and the active region 100. The anti-fuse storage layout also includes: a conductive region 115 configured to define a conductive layer to electrically connect the drain or source of the control transistor <141> and the bit line; and an electrical connection pillar positioned between the conductive region 115 and the bit line region 105 and configured to electrically connect the conductive layer and the bit line. In another example, referring to FIG. 6, the bit line region 105 may be positioned directly above the corresponding active region 100. That is, there is a facing region provided between the bit line region 105 and the active region 100. The anti-fuse storage layout also includes: an electrical connection pillar 125 positioned between the active region 100 and the bit line region 105 and configured to electrically connect the active layer and the bit line defined by the active region 100.

It is to be noted that in practical applications electrical connection between the active layer and the bit line may also be implemented by means of a transition material in addition to using the electrical connection pillar 125. That is, the electrical connection between the active layer and the bit line may be as below: the active layer-the transition material-the electrical connection pillar 125-the transition material-the bit line. In this way, transmission efficiency of electrical signals between the active layer and the bit line is improved.

To sum up, in the anti-fuse storage layout, when the anti-fuse transistor <131> in a certain memory cell region 101 is programmed by means of the programming control region 104, the other memory cell region 101 sharing the programming control region 104 with this first memory cell region 101 is not programmed. In this way, when a certain memory cell region 101 is programmed, it is avoidable causing interference or damage to other memory cell region 101 adjacent to the foregoing one. In addition, to protect a memory cell region 101 adjacent to the memory cell region 101 that needs to be programmed, the anti-fuse storage layout provided by the embodiments of the present disclosure does not need to be provided with a precharge region. In one aspect, this is advantageous to reducing the layout area of the anti-fuse storage layout, such that it is advantageous to reducing costs of the anti-fuse memory fabricated according to the anti-fuse storage layout and reducing the size of the anti-fuse memory. In another aspect, a precharge operation is not required when programming a certain memory cell region 101, which is advantageous to simplifying an operation timing sequence.

Figure 7:
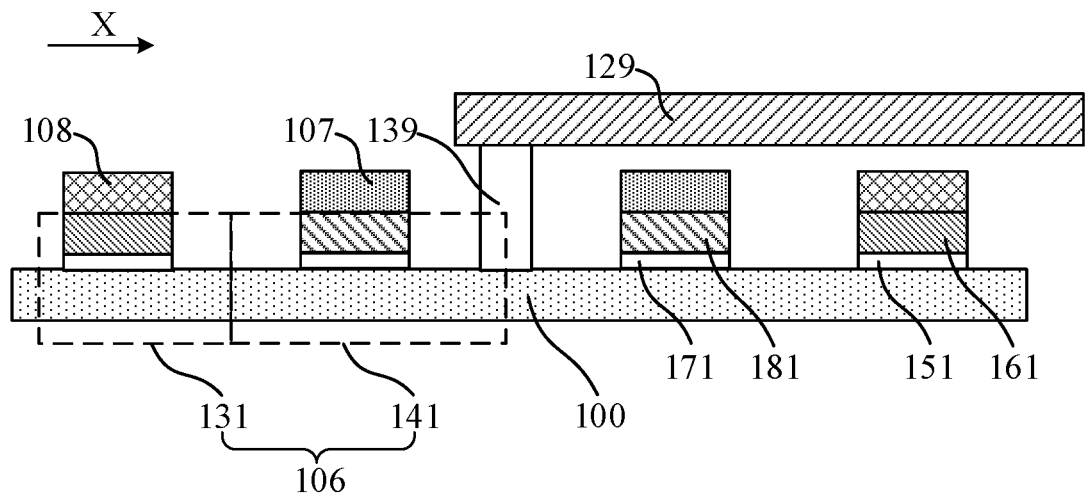
FIG. 7 is a schematic diagram showing a sectional structure of an anti-fuse memory corresponding to the anti-fuse storage layout provided in FIG. 6 along a direction X.

Another embodiment of the present disclosure provides an anti-fuse memory, and the anti-fuse memory provided by another embodiment of the present disclosure will be described in detail below with reference to the accompanying drawings. FIG. 7 is a schematic diagram showing a sectional structure of an anti-fuse memory corresponding to the anti-fuse storage layout provided in FIG. 6 along the direction X, and FIG. 8 and FIG. 9 are schematic diagrams showing two types of sectional structure of the anti-fuse memory corresponding to the anti-fuse storage layout provided in FIG. 6 along the direction Y.

Figure 8:
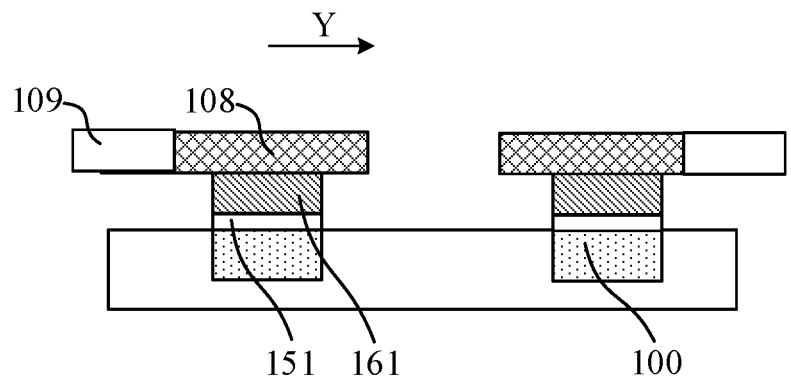
FIG. 8 and FIG. 9 are schematic diagrams showing two types of sectional structure of the anti-fuse memory corresponding to the anti-fuse storage layout provided in FIG. 6 along a direction Y.
Figure 9:
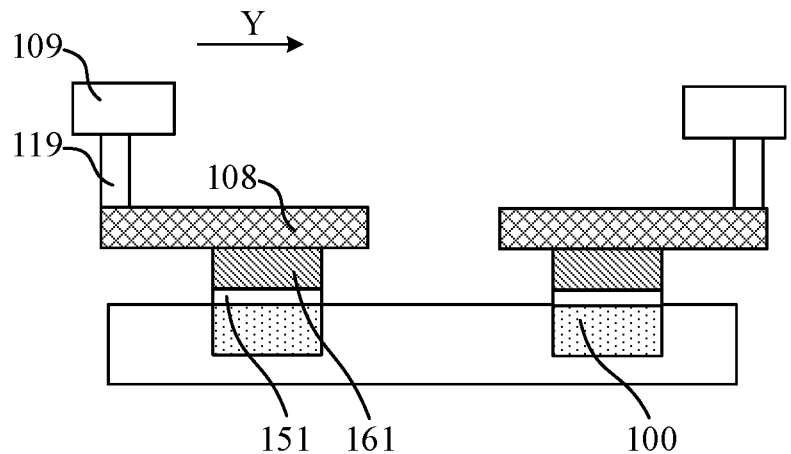

With combined reference to FIG. 7 to FIG. 9, the anti-fuse memory includes: at least two memory cells 106 arranged along the first direction X and the second direction Y, each of the at least two memory cells 106 including an anti-fuse transistor 131 and a control transistor 141 arranged along the first direction X, a gate structure of the anti-fuse transistor 131 including a first gate dielectric layer 151 and a first gate layer 161 arranged in a stack, and a gate structure of the control transistor 141 including a second gate dielectric layer 171 and a second gate layer 181 arranged in a stack; a word line layer 107, the word line layer 107 extending along the second direction Y and being electrically connected to a second gate layer 181 of the control transistor 141 arranged along the second direction Y; an electrical connection layer 108, the electrical connection layer 108 extending along the second direction Y and being electrically connected to the first gate layer 161 of the anti-fuse transistor 131; and a programming control layer 109, the programming control layer 109 extending along a third direction Z (referring to FIG. 1) and being electrically connected to the first gate layer 161 arranged along the first direction X by means of the electrical connection layer 108.

In this way, the extension direction of the word line region 107 is different from the extension direction of the programming control region 109, such that the first gate layers 161 arranged along the first direction X are electrically connected to the same programming control layer 109, the control transistor 141 in the adjacent memory cell 106 sharing the programming control layer 109 is electrically connected to different word line layers 107. When the anti-fuse transistor 131 in a certain memory cell 106 is programmed by means of the programming control region 109 and the control transistor 141 is enabled by means of the word line layer 107 electrically connected to the control transistor 141 in this memory cell 106, the control transistor 141 in the other memory cell region 106 sharing the programming control region 109 is electrically connected to other word line layer 107, so the control transistor 141 in the other memory cell 106 sharing the programming control region 109 is not enabled. Thus the anti-fuse transistor 131 in the same memory cell 106 as this control transistor 141 not enabled is not programmed. In this way, when a certain memory cell 106 is programmed, it is avoidable causing interference or damage to other memory cell 106 adjacent to the foregoing one.

In addition, to protect a memory cell 106 adjacent to the memory cell 106 that needs to be programmed, the anti-fuse memory provided by the embodiments of the present disclosure does not need to be provided with a precharge module. In one aspect, this is advantageous to reducing an overall size of the anti-fuse memory, such that it is advantageous to reducing fabrication costs of the anti-fuse memory. In another aspect, a precharge operation is not required when programming a certain memory cell 106, which is advantageous to simplifying an operation timing sequence.

In some embodiments, referring to FIG. 8, the electrical connection layer 108 and the programming control layer 109 may be in the same layer. This is advantageous to reducing the overall thickness of the anti-fuse memory and improving the integration density of functional film layers in the anti-fuse memory.

In some embodiments, referring to FIG. 9, the electrical connection layer 108 and the programming control layer 109 are in different layers. The anti-fuse memory may also include a conductive pillar 119. The conductive pillar 119 is positioned between the electrical connection layer 108 and the programming control layer 109, and is electrically connected to the electrical connection layer 108 and the programming control layer 109.

It is to be noted that in practical applications, due to limitations of conductive materials of the electrical connection layer 108 and the programming control layer 109, electrical connection between the electrical connection layer 108 and the programming control layer 109 may also be implemented by means of a transition material in addition to using the conductive pillar 119. That is, the electrical connection between the electrical connection layer 108 and the programming control layer 109 may be as below: the electrical connection layer 108-the transition material-the conductive pillar 119-the transition material-the programming control layer 109. In this way, transmission efficiency of electrical signals between the electrical connection layer 108 and the programming control layer 109 is improved.

In some embodiments, the thickness of the first gate dielectric layer 151 is less than or equal to 30 angstroms, and the thickness of the second gate dielectric layer 171 is less than or equal to 30 angstroms. In the anti-fuse memory provided by the embodiment of the present disclosure, there is no need to provide a precharge module to protect a memory cell 106 adjacent to the memory cell 106 required to be programmed. In this case, when the control transistor 141 uses a transistor with a thinner gate dielectric layer, no adverse effect is caused to the anti-fuse transistor 131 in the same memory cell 106 as the control transistor 141. Therefore, for any memory cell 106, the control transistor 141 and the anti-fuse transistor 131 therein may use transistors with a thinner gate dielectric layer, which is advantageous to further reducing the overall size of the anti-fuse memory to meet the requirement for higher integration density of the anti-fuse memory.

In some embodiments, with continued reference to FIG. 7, the anti-fuse memory may also include a bit line layer 129. The bit line layer 129 extends along the first direction X, and the bit line layer 129 is electrically connected to the control transistor 141 arranged along the first direction X.

The anti-fuse memory may also include an electrical connection pillar 139. The electrical connection pillar 139 is positioned between the bit line layer 129 and the control transistor 141, and is electrically connected to the bit line layer 129 and the control transistor 141. It is to be noted that in practical applications, electrical connection between the bit line layer 129 and the control transistor 141 may also be implemented by means of a transition material in addition to using the electrical connection pillar 139. That is, the electrical connection between the bit line layer 129 and the control transistor 141 may be as below: the bit line layer 129-the transition material-the electrical connection pillar 139-the transition material-the control transistor 141. In this way, transmission efficiency of electrical signals between the bit line layer 129 and the control transistor 141 is improved.

To sum up, when the anti-fuse transistor 131 in a certain memory cell 106 is programmed by means of the programming control region 109, the other memory cell 106 sharing the programming control region 109 with this first memory cell region 106 is not programmed. In this way, when a certain memory cell 106 is programmed, it is avoidable causing interference or damage to other memory cell 106 adjacent to the foregoing one. In addition, to protect a memory cell 106 adjacent to the memory cell 106 that needs to be programmed, the anti-fuse memory provided by the embodiments of the present disclosure does not need to be provided with a precharge module. In one aspect, this is advantageous to reducing the overall size of the anti-fuse memory, such that it is advantageous to reducing the fabrication costs of the anti-fuse memory. In another aspect, a precharge operation is not required when programming a certain memory cell 106, which is advantageous to simplifying an operation timing sequence.

Figure 10:
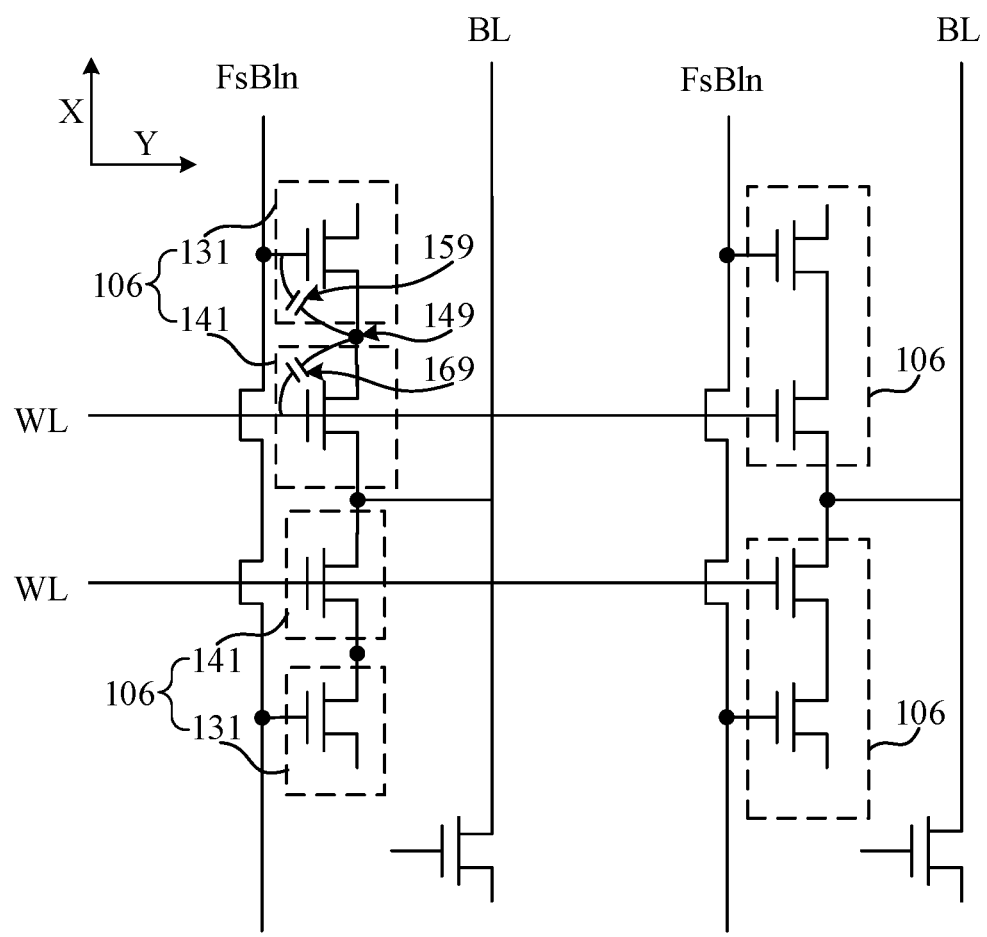
FIG. 10 is a schematic diagram of a partial circuit structure corresponding to an anti-fuse memory according to another embodiment of the present disclosure.

Yet another embodiment of the present disclosure provides a design method for an anti-fuse memory, and this design method is configured for designing the anti-fuse memory provided by the foregoing embodiments. The design method for an anti-fuse memory provided by yet another embodiment of the present disclosure will be described in detail below with reference to FIG. 6 to FIG. 10. FIG. 10 is a schematic diagram of a partial circuit structure corresponding to an anti-fuse memory according to yet another embodiment of the present disclosure.

Referring to FIG. 6 to FIG. 10, the design method for the anti-fuse memory includes following steps: defining the memory cell 106 programming in the two adjacent memory cells 106 arranged along the first direction X as a first memory cell, and defining the memory cell 106 not programming as a second memory cell, a node configured to connect the control transistor 141 and the anti-fuse transistor 131 in the second memory cell being defined as a connection node 149, a first parasitic capacitance 159 being provided between the first gate layer 161 and the connection node 149, a second parasitic capacitance 169 being provided between the second gate layer 181 and the connection node 149, a first voltage difference threshold being provided between the first gate layer 161 and the connection node 149 in the second memory cell during the programming, the first voltage difference threshold being defined as a voltage difference between the first gate layer 161 and the connection node 149 corresponding to breakdown of the anti-fuse transistor 131, and a voltage of the programming control layer 109 corresponding to the first memory cell being defined as a programming voltage.

The design method also includes: obtaining a relationship between the first parasitic capacitance 159 and the second parasitic capacitance 169 based on the programming voltage and the voltage difference threshold; and based on the relationship between the first parasitic capacitance 159 and the second parasitic capacitance 169, designing a channel size of the anti-fuse transistor 131 and/or a thickness of the first gate dielectric layer 151 in the second memory cell, and designing a channel size of the control transistor 141 and/or a thickness of the second gate dielectric layer 171 in the second memory cell.

It is to be noted that when the voltage difference between the first gate layer 161 and the connection node 149 of the anti-fuse transistor 131 is less than or equal to the first voltage difference threshold, the first gate dielectric layer 151 of the anti-fuse transistor 131 is not broken down. Based on the preset programming voltage and the preset first voltage difference threshold and by means of a coupling action between the first parasitic capacitance 159 and the second parasitic capacitance 169 in the memory cell 106 that does not need to be programmed, the connection node 149 has a higher voltage. That is, the anti-fuse transistor 131 in the memory cell 106 that does not need to be programmed has a higher drain voltage. In this way, it is realized that the voltage difference between the first gate layer 161 and the connection node 149 of the memory cell 106 that does not need to be programmed is less than or equal to the first voltage difference threshold, such that when a certain anti-fuse transistor 131 is programmed, other anti-fuse transistor 131 adjacent to the foregoing one is not broken down.

In addition, it is defined that during programming, there is a second voltage difference threshold between the second gate layer 181 and the connection node 149 in the second memory cell. The second voltage difference threshold is defined as a voltage difference between the second gate layer 181 and the connection node 149 corresponding to breakdown of the control transistor 141. Magnitudes of the first parasitic capacitance 159 and the second parasitic capacitance 169 may be designed according to the preset programming voltage and the preset first voltage difference threshold and the second voltage difference threshold. Further, according to the magnitudes of the first parasitic capacitance 159 and the second parasitic capacitance 169, the channel size of the anti-fuse transistor 131 and/or the thickness of the first gate dielectric layer 151 are designed, and the channel size of the control transistor 141 and/or the thickness of the second gate dielectric layer 171 are designed.

In some embodiments, the first parasitic capacitance 159, the second parasitic capacitance 169, the programming voltage and the voltage difference threshold satisfy an equation as below: $U=R1*U0/(R1+R2)$, wherein U represents an arbitrary value less than or equal to the voltage difference threshold, U0 represents the programming voltage, R1 represents a first capacitive reactance corresponding to the first parasitic capacitance 159, and R2 represents a second capacitive reactance corresponding to the second parasitic capacitance 169.

It is to be noted that the control transistor 141 in the first memory cell is enabled because the bit line WL electrically connected to the control transistor 141 is at a cut-in voltage, such that voltage of a node at connection between the control transistor 141 and the anti-fuse transistor 131 in the first memory cell is at a low potential. Thus, when the first gate layer 161 in the anti-fuse transistor 131 of the first memory cell receives the programming voltage and thus is enabled, the first gate layer 161 in the anti-fuse transistor 131 of the second memory cell is also at the programming voltage. However, the control transistor 141 in the second memory cell is not enabled because the bit line WL electrically connected to the control transistor 141 is at a cut-off potential. Therefore, the voltage difference between the first gate layer 161 of the anti-fuse transistor 131 and the second gate layer 181 of the control transistor 141 in the second memory cell is equivalent to an absolute value of the difference between the programming voltage and the cut-off voltage. The first capacitive reactance corresponding to the first parasitic capacitance 159 and the second capacitive reactance corresponding to the second parasitic capacitance 169 in the second memory cell are in a series-connected state to share the above absolute value of the difference. That is, the voltage difference across the first capacitive reactance is the voltage difference between the first gate layer 161 in the anti-fuse transistor 131 of the second memory cell and the connection node 149, and sum of the voltage difference across the first capacitive reactance and the voltage difference across the second capacitive reactance is equal to the above absolute value of the difference. Therefore, the first parasitic capacitance 159, the second parasitic capacitance 169, the programming voltage and the voltage difference threshold satisfy the above equation.

Thus, at the preset programming voltage and the preset voltage difference threshold, it is advantageous to ensuring, after parasitic capacitance coupling between the anti-fuse transistor 131 and the control transistor 141 in the memory cell 106 that does not need to be programmed, that the programming voltage applied to the gate of the anti-fuse transistor 131 will not cause the first gate dielectric layer 151 of the anti-fuse transistor 131 to be broken down.

It is to be noted that when the above-mentioned active region is defined as an N-type active region, the cut-in voltage of the control transistor 141 is high, and the cut-off voltage is low. During programming, the programming voltage may be high, the corresponding bit line voltage may be low, the cut-in voltage is much smaller than the programming voltage, and the above absolute value of the voltage difference is close to or equal to the programming voltage. When the above-mentioned active region is defined as a P-type active region, the cut-in voltage of the control transistor 141 is low, and the cut-off voltage is high. During programming, the programming voltage may be high, and the corresponding bit line voltage may be low; and compared with the N-type active region, the above absolute value of the voltage difference becomes smaller.

In addition, in practical applications, the first capacitive reactance may also be obtained according to the channel size of the anti-fuse transistor 131 and the thickness of the first gate dielectric layer 151, and the second capacitive reactance may also be obtained according to the channel size of the control transistor 141 and the thickness of the second gate dielectric layer 171. Next, the programming voltage and the voltage difference threshold are designed based on the first capacitive reactance and the second capacitive reactance. In this way, it is realized that the voltage difference between the first gate layer 161 and the connection node 149 of the memory cell 106 that does not need to be programmed is less than or equal to the voltage difference threshold, such that when a certain anti-fuse transistor 131 is programmed, other anti-fuse transistor 131 adjacent to the foregoing one is not broken down.

In summary, by means of the above design method for an anti-fuse memory, designers can design the sizes of the control transistor 141 and the anti-fuse transistor 131 according to the needs, thereby improving diversity of the designed anti-fuse memory. In some embodiments, both the control transistor 141 and the anti-fuse transistor 131 may adopt transistors with a thinner gate dielectric layer, which is advantageous to further reducing the overall size of the anti-fuse memory to meet the requirement for higher integration density of the anti-fuse memory.

Still another embodiment of the present disclosure provides an anti-fuse storage circuit. The anti-fuse storage circuit provided by still another embodiment of the present disclosure will be described in detail below with reference to FIG. 6 to FIG. 10.

Referring to FIG. 9, the anti-fuse storage circuit includes: a plurality of memory cells 106, each of the plurality of memory cells 106 including an anti-fuse transistor 131 and a control transistor 141 connected to each other, and a connection node 149 between the anti-fuse transistor 131 and the control transistor 141 being defined as a reference node; a bit line BL connected to the anti-fuse transistors 131 arranged along a first direction X, each of the anti-fuse transistors 131 being electrically connected to the bit line BL by means of the control transistor 141; a word line WL connected to a gate of the control transistor 141 arranged in a second direction Y, the word line WL being configured to enable the selected control transistor 141 according to a row strobe signal, such that the bit line BL is electrically connected to the anti-fuse transistor 131; and a programming control line FsBln connected to a gate of the anti-fuse transistor 131 arranged along the first direction X, the anti-fuse transistor 131 being configured to programme according to a programming signal provided by the programming control line FsBln.

There is a first parasitic capacitance 159 between the gate of the anti-fuse transistor 131 and the reference node, and there is a second parasitic capacitance 169 between the gate of the control transistor 141 and the reference node. During programming by means of the anti-fuse transistor 131 of a selected one of the plurality of memory cells 106, the reference nodes of the adjacent anti-fuse transistor 131 is coupled to a preset voltage, and a difference value between the preset voltage and a voltage of the programming signal is less than or equal to a voltage difference threshold, wherein the voltage difference threshold is a voltage difference between the gate and a drain corresponding to breakdown of the anti-fuse transistor 131.

In some embodiments, when the anti-fuse transistor 131 in a certain memory cell 106 is programmed, a high voltage such as 5V~6V is applied to the programming control line FsBln. At this moment, the bit line BL electrically connected to this anti-fuse transistor 131 that needs to be programmed is pulled down to a low potential, and a voltage of 1.2V is applied to the word line WL electrically connected to the control transistor 141 in the memory cell 106 that needs to be programmed, such that the control transistor 141 is enabled, and the drain of the anti-fuse transistor 131 that needs to be programmed is at a low potential. In this case, a voltage difference between the first gate layer 161 of the anti-fuse transistor 131 that needs to be programmed and a drain needs to be greater than the voltage difference threshold, such that the anti-fuse transistor 131 that needs to be programmed is enabled. However, in another memory cell 106 sharing the programming control line FsBln with the anti-fuse transistor 131 that needs to be programmed, the word line WL electrically connected to the control transistor 141 in this memory cell 106 is at a low potential, the voltage of the connection node 149 may reach 3V due to the parasitic capacitance coupling between the anti-fuse transistor 131 and the control transistor 141 in the memory cell 106, such that the voltage difference between the first gate layer 161 of the anti-fuse transistor 131 that does not need to be programmed and the connection node 149 is less than the voltage difference threshold, to protect the anti-fuse transistor 131.

In addition, to protect an anti-fuse transistor 131 adjacent to the anti-fuse transistors 131 that needs to be programmed, the anti-fuse storage circuit provided by the embodiments of the present disclosure does not need to be provided with a precharge circuit. In one aspect, this is advantageous to reducing a layout area of the anti-fuse storage circuit, such that it is advantageous to reducing the fabrication costs of the anti-fuse storage circuit. In another aspect, a precharge operation is not required when programming a certain anti-fuse transistors 131, which is advantageous to simplifying an operation timing sequence.

Those of ordinary skill in the art can understand that the above-mentioned embodiments are some embodiments for realizing the present disclosure, but in practical applications, various changes can be made to them in form and details without departing from the spirit and scope of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. An anti-fuse storage layout, comprising:
   active regions extending along a first direction and being discretely arranged along a second direction, each of the active regions comprising at least two memory cell regions arranged along the first direction, each of the at least two memory cell regions comprising an anti-fuse region and a control region arranged along the first direction, the control regions of the adjacent memory cell regions being adjacent to each other along the first direction, the anti-fuse region being configured to define an anti-fuse transistor, and the control region being configured to define a control transistor;
   a word line region extending along the second direction and intersecting with the control region, the word line region being configured to define a word line electrically connected to a gate of the control transistor;
   an electrical connection region extending along the second direction and intersecting with the anti-fuse region, the electrical connection region being configured to define an electrical connection layer electrically connected to a gate of the anti-fuse transistor; and
   a programming control region extending along a third direction and being positioned at one side of the corresponding active region, the programming control region intersecting with the electrical connection region arranged along the first direction, the programming control region being configured to define a programming control layer, and the programming control layer being electrically connected to the electrical connection layer arranged along the first direction.

2. The anti-fuse storage layout according to claim 1, wherein the programming control region and the electrical connection region are in the same layer, the programming control region and the electrical connection region being adjacent to each other.

3. The anti-fuse storage layout according to claim 1, wherein the programming control region and the electrical connection region are in different layers, the programming control region and the electrical connection region having a facing region.

4. The anti-fuse storage layout according to claim 3, wherein the anti-fuse storage layout further comprises:
a through-hole region positioned in the facing region between the programming control region and the electrical connection region, the through-hole region being configured to define a conductive pillar, and the conductive pillar being electrically connected to the electrical connection layer and the programming control layer.

5. The anti-fuse storage layout according to claim 1, wherein the first direction is the same as the third direction.

6. The anti-fuse storage layout according to claim 1, wherein the first direction is perpendicular to the second direction.

7. The anti-fuse storage layout according to claim 1, wherein the active region is configured to define an N-type active layer.

8. The anti-fuse storage layout according to claim 1, further comprising:
a bit line region extending along the first direction, the bit line region being configured to define a bit line electrically connected to the control transistor arranged along the first direction.

9. An anti-fuse memory, comprising:
at least two memory cells arranged along a first direction and a second direction, each of the at least two memory cells comprising an anti-fuse transistor and a control transistor arranged along the first direction, a gate structure of the anti-fuse transistor comprising a first gate dielectric layer and a first gate layer arranged in a stack, and a gate structure of the control transistor comprising a second gate dielectric layer and a second gate layer arranged in a stack;
a word line layer, the word line layer extending along the second direction and being electrically connected to the first gate layer of the control transistor arranged along the second direction;
an electrical connection layer, the electrical connection layer extending along the second direction and being electrically connected to the second gate layer of the anti-fuse transistor; and
a programming control layer, the programming control layer extending along a third direction and being electrically connected to the first gate layer arranged along the first direction by means of the electrical connection layer.

10. The anti-fuse memory according to claim 9, wherein the electrical connection layer and the programming control layer are in the same layer.

11. The anti-fuse memory according to claim 9, wherein the electrical connection layer and the programming control layer are in different layers; the anti-fuse memory further comprising:
a conductive pillar, the conductive pillar being positioned between the electrical connection layer and the programming control layer, and being electrically connected to the electrical connection layer and the programming control layer.

12. The anti-fuse memory according to claim 9, wherein a thickness of the first gate dielectric layer is less than or equal to 30 angstroms, a thickness of the second gate dielectric layer being less than or equal to 30 angstroms.

13. The anti-fuse memory according to claim 9, further comprising: a bit line layer extending along the first direction, wherein the bit line layer is electrically connected to the control transistor arranged along the first direction.

14. An anti-fuse storage circuit, comprising:
a plurality of memory cells, each of the plurality of memory cells comprising an anti-fuse transistor and a control transistor connected to each other, and a connection node between the anti-fuse transistor and the control transistor being defined as a reference node;
a bit line connected to the anti-fuse transistors arranged along a first direction, each of the anti-fuse transistors being electrically connected to the bit line by means of the control transistor;
a word line connected to a gate of the control transistor arranged in a second direction, the word line being configured to enable the selected control transistor according to a row strobe signal, such that the bit line is electrically connected to the anti-fuse transistor; and
a programming control line connected to a gate of the anti-fuse transistor arranged along the first direction, the anti-fuse transistor being configured to programme according to a programming signal provided by the programming control line;
wherein there is a first parasitic capacitance between the gate of the anti-fuse transistor and the reference node, and there being a second parasitic capacitance between the gate of the control transistor and the reference node, during programming by means of the anti-fuse transistor of a selected one of the plurality of memory cells, the reference nodes of the adjacent anti-fuse transistors being coupled to a preset voltage, and a difference value between the preset voltage and a voltage of the programming signal being less than or equal to a voltage difference threshold, and the voltage difference threshold being a voltage difference between the gate and a drain corresponding to breakdown of the anti-fuse transistor.

* * * * *